US006355555B1

(12) United States Patent
Park

(10) Patent No.: US 6,355,555 B1
(45) Date of Patent: Mar. 12, 2002

(54) METHOD OF FABRICATING COPPER-BASED SEMICONDUCTOR DEVICES USING A SACRIFICIAL DIELECTRIC LAYER

(75) Inventor: Stephen Keetai Park, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/493,384

(22) Filed: Jan. 28, 2000

(51) Int. Cl.$^7$ .......................................... H01L 21/4763
(52) U.S. Cl. ...................... 438/634; 438/631; 438/633; 438/624; 438/637; 438/687; 257/760; 257/762
(58) Field of Search ................................ 438/687, 637, 438/638, 634, 633, 631, 627, 624, 623, 618; 257/751, 760, 762

(56) References Cited

U.S. PATENT DOCUMENTS

| 5,559,055 A | | 9/1996 | Chang et al. | 438/586 |
| 5,880,018 A | * | 3/1999 | Boeck et al. | 438/619 |
| 5,953,626 A | | 9/1999 | Hause et al. | 438/622 |
| 6,010,962 A | * | 1/2000 | Liu et al. | 438/687 |
| 6,037,664 A | * | 3/2000 | Zhao et al. | 257/756 |

FOREIGN PATENT DOCUMENTS

| EP | 0971409 A1 | 7/1999 |
| WO | WO 99/09593 | 2/1999 |
| WO | WO 00/41224 | 7/2000 |

OTHER PUBLICATIONS

International Search Report dated Jan. 23, 2001 (PCT/US00/25788; TT3586–PCT).

* cited by examiner

Primary Examiner—Charles Bowers
Assistant Examiner—Hsien-Ming Lee
(74) Attorney, Agent, or Firm—Williams, Morgan & Amerson

(57) ABSTRACT

A method is provided for forming a copper interconnect, the method including forming a sacrificial dielectric layer above a structure layer, forming an opening in the sacrificial dielectric layer and forming a copper layer above the sacrificial dielectric layer and in the opening. The method also includes forming the copper interconnect by removing portions of the copper layer above the sacrificial dielectric layer, leaving the copper interconnect in the opening. The method further includes removing the sacrificial dielectric layer above the structure and adjacent the copper interconnect, and forming a low dielectric constant dielectric layer above the structure and adjacent the copper interconnect.

20 Claims, 20 Drawing Sheets

METHOD OF FABRICATING COPPER-BASED SEMICONDUCTOR DEVICES USING A SACRIFICIAL DIELECTRIC LAYER

BACKGROUND OF THE INVENTION

1. Field of the Invention

This invention relates generally to semiconductor fabrication technology, and, more particularly, to techniques for filling contact openings and vias with copper and creating copper interconnections and lines.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the size, or scale, of the components of a typical transistor also requires reducing the size and cross-sectional dimensions of electrical interconnects to contacts to active areas, such as $N^+$ ($P^+$) source/drain regions and a doped-polycrystalline silicon (doped-polysilicon or doped-poly) gate conductor, and the like. As the size and cross-sectional dimensions of electrical interconnects get smaller, resistance increases and electromigration increases. Increased resistance and electromigration are undesirable for a number of reasons. For example, increased resistance may reduce device drive current, and source/drain current through the device, and may also adversely affect the overall speed and operation of the transistor. Additionally, electromigration effects in aluminum (Al) interconnects, where electrical currents actually carry Al atoms along with the current, causing them to electromigrate, may lead to degradation of the Al interconnects, further increased resistance, and even disconnection and/or delamination of the Al interconnects.

The ideal interconnect conductor for semiconductor circuitry will be inexpensive, easily patterned, have low resistivity, and high resistance to corrosion, electromigration, and stress migration. Aluminum (Al) is most often used for interconnects in contemporary semiconductor fabrication processes primarily because Al is inexpensive and easier to etch than, for example, copper (Cu). However, because Al has poor electromigration characteristics and high susceptibility to stress migration, it is typically necessary to alloy Al with other metals.

As discussed above, as semiconductor device geometries shrink and clock speeds increase, it becomes increasingly desirable to reduce the resistance of the circuit metallization.

The one criterion that is most seriously compromised by the use of Al for interconnects is that of conductivity. This is because the three metals with lower resistivities (Al has a resistivity of $2.824 \times 10^{-6}$ ohms-cm at 20° C.), namely, silver (Ag) with a resistivity of $1.59 \times 10^{-6}$ ohms-cm (at 20° C.), copper (Cu) with a resistivity of $1.73 \times 10^{-6}$ ohms-cm (at 20° C.), and gold (Au) with a resistivity of $2.44 \times 10^{-6}$ ohms-cm (at 20 C.), fall short in other significant criteria. Silver, for example, is relatively expensive and corrodes easily, and gold is very costly and difficult to etch. Copper, with a resistivity nearly on par with silver, immunity from electromigration, high ductility (which provides high immunity to mechanical stresses generated by differential expansion rates of dissimilar materials in a semiconductor chip) and high melting point (1083° C. for Cu vs. 659° C. for Al), fills most criteria admirably. However, Cu is exceedingly difficult to etch in a semiconductor environment. As a result of the difficulty in etching Cu, an alternative approach to forming vias and metal lines must be used. The damascene approach, consisting of etching openings such as trenches in the dielectric for lines and vias and creating in-laid metal patterns, is the leading contender for fabrication of sub-0.25 micron (su-0.25μ) design rule Cu-metallized circuits.

However, the lower resistance and higher conductivity of the Cu interconnects, coupled with higher device density and, hence, decreased distance between the Cu interconnects, may lead to increased capacitance between the Cu interconnects. Increased capacitance between the Cu interconnects, in turn, results in increased RC time delays and longer transient decay times in the semiconductor device circuitry, causing decreased overall operating speeds of the semiconductor devices.

One conventional solution to the problem of increased capacitance between the Cu interconnects is to use "low dielectric constant" or "low K" dielectric materials, where K is less than or equal to about 4, for the interlayer dielectric layers (ILD's) in which the Cu interconnects are formed using the damascene techniques. However, low K dielectric materials are difficult materials to use in conjunction with the damascene techniques. For example, low K dielectric materials are susceptible to damage during the etching and subsequent processing steps used in the damascene techniques.

The present invention is directed to overcoming, or at least reducing the effects of, one or more of the problems set forth above.

SUMMARY OF THE INVENTION

In one aspect of the present invention, a method is provided for forming a copper interconnect, the method including forming a sacrificial dielectric layer above a structure layer, forming an opening in the sacrificial dielectric layer and forming a copper layer above the sacrificial dielectric layer and in the opening. The method also includes forming the copper interconnect by removing portions of the copper layer above the sacrificial dielectric layer, leaving the copper interconnect in the opening. The method further includes removing the sacrificial dielectric layer above the structure and adjacent the copper interconnect, and forming a low dielectric constant dielectric layer above the structure and adjacent the copper interconnect.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
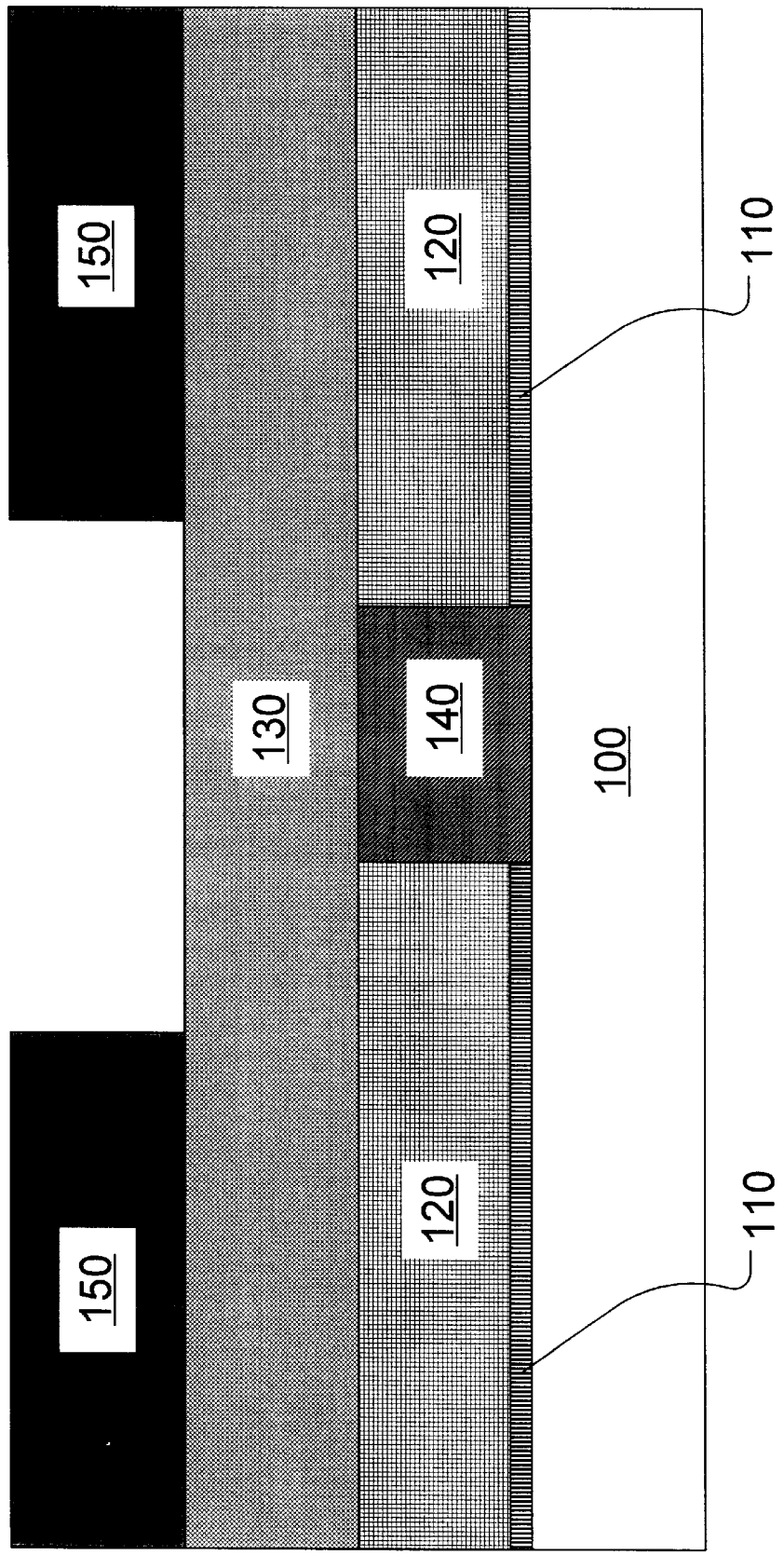
FIGS. 1–8 schematically illustrate a single-damascene copper interconnect process flow according to various embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for semiconductor device fabrication according to the present invention are shown in FIGS. 1–20. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

As shown in FIG. 1, an etch stop layer (ESL) 110 (typically silicon nitride, $Si_3N_4$, or SiN, for short) and an intermetal via connection 140 may be formed above a structure 100 such as a semiconducting substrate. However, the present invention is not limited to the formation of a Cu-based interconnect above the surface of a semiconducting substrate such as a silicon wafer, for example. Rather, as will be apparent to one skilled in the art upon a complete reading of the present disclosure, a Cu-based interconnect formed in accordance with the present invention may be formed above previously formed semiconductor devices and/or process layer, e.g., transistors, or other similar structure. In effect, the present invention may be used to form process layers on top of previously formed process layers. The structure 100 may be an underlayer of semiconducting material, such as a silicon substrate or wafer, or, alternatively, may be an underlayer of semiconductor devices (see FIG. 10, for example), such as a layer of metal oxide semiconductor field effect transistors (MOSFETs), and the like, and/or a metal interconnection layer or layers (see FIG. 9, for example) and/or an interlayer dielectric (ILD) layer or layers, and the like.

In a single-damascene copper process flow, according to various embodiments of the present invention, as shown in FIGS. 1–8, a first sacrificial dielectric layer 120 is formed above the structure 100, above the ESL 110 and adjacent the intermetal via connection 140. A second sacrificial dielectric layer 130 is formed above the first sacrificial dielectric layer 120 and above the intermetal via connection 140. The first sacrificial dielectric layer 120 has the intermetal via connection 140 disposed therein. The structure 100 has the ESL 110 (also known as a "hard mask" and typically formed of silicon nitride, $Si_3N_4$, or SiN, for short) formed and patterned thereon, between the structure 100 and the first sacrificial dielectric layer 120 and adjacent the intermetal via connection 140. If necessary, the second sacrificial dielectric layer 130 may be planarized using chemical-mechanical planarization (CMP).

The first and second sacrificial dielectric layers 120 and 130 may be formed from a variety of dielectric materials and one or both may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The first and second sacrificial dielectric layers 120 and 130 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3$/$SrTiO_3$), and the like.

The first and second sacrificial dielectric layers 120 and 130 may be formed by a variety of known techniques for forming such layers, e.g., chemical vapor deposition (CVD), low-pressure CVD (LPCVD), plasma-enhanced CVD (PECVD), sputtering, physical vapor deposition (PVD), thermal growing, and the like. The first and second sacrificial dielectric layers 120 and 130 may each have thicknesses in a range of about 1000–2500 Å. In one illustrative embodiment, the first and second sacrificial dielectric layers 120 and 130 are each comprised of silicon dioxide ($SiO_2$) having a thickness of approximately 1000 Å, formed by being blanket-deposited by LPCVD process for higher throughput.

Figure 2:
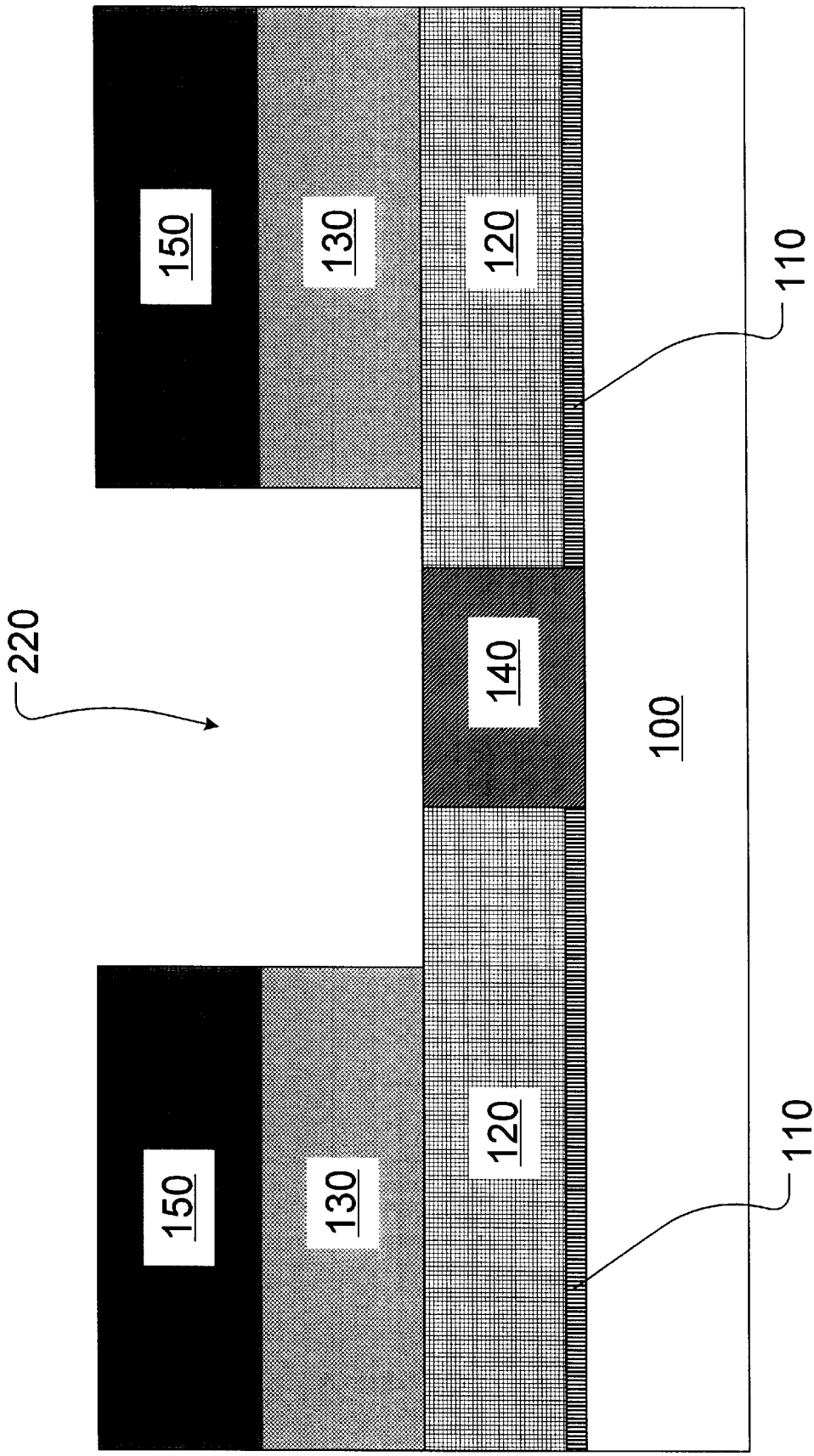

As shown in FIG. 2, a metallization pattern is then formed by using a patterned photomask 150 (FIGS. 1–2) and photolithography. For example, openings (such as trench 220) for conductive metal lines, contact holes, via holes, and the like, are etched into the second sacrificial dielectric layer 130 (FIG. 2). The opening 220 may be formed by using a variety of known anisotropic etching techniques, such as a reactive ion etching (RIE) process using hydrogen bromide (HBr) and argon (Ar) as the etchant gases, for example. Alternatively, an RIE process with $CHF_3$ and Ar as the etchant gases may be used, for example. Dry etching may also be used, in various illustrative embodiments.

Figure 3:
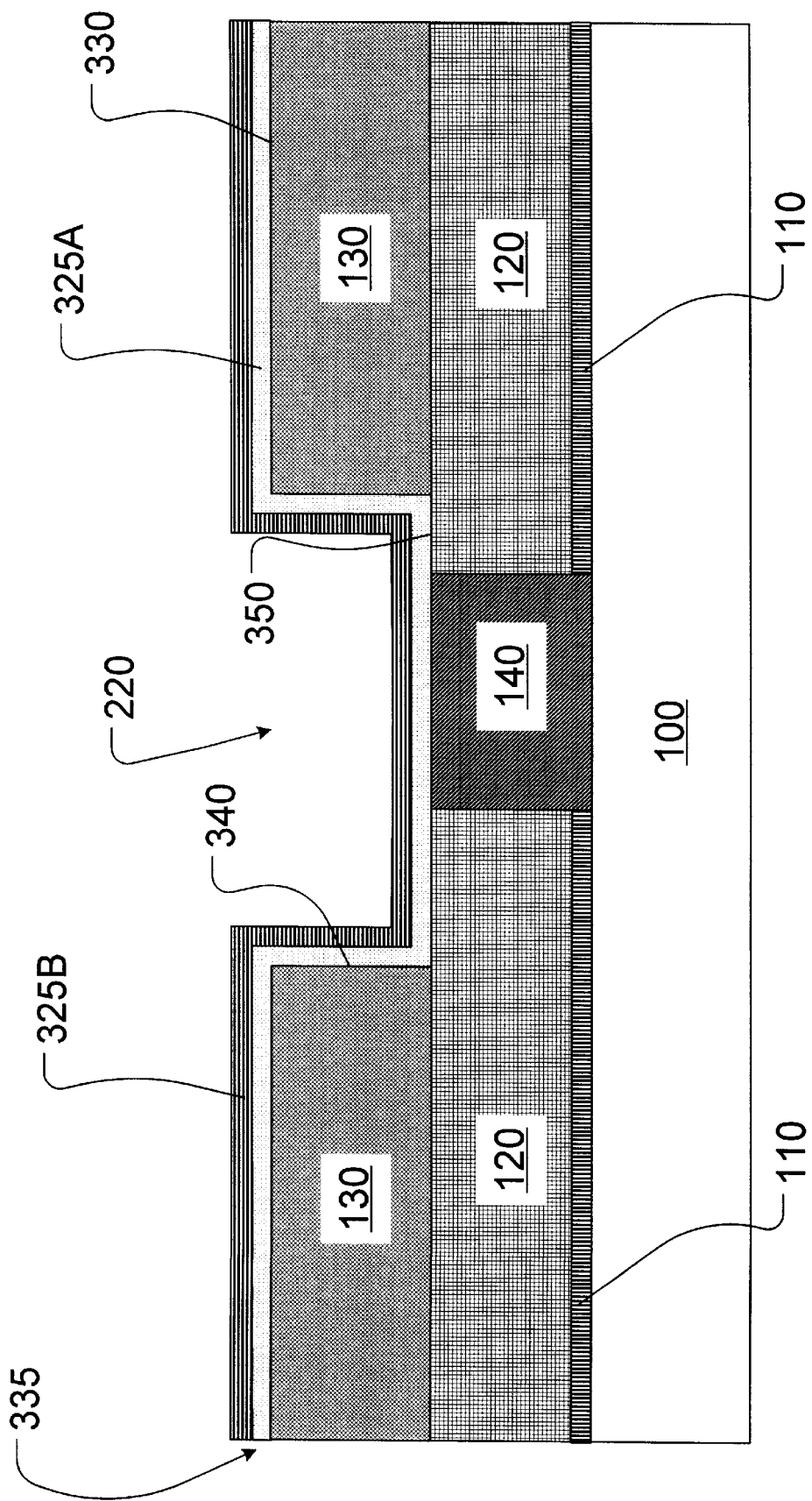

As shown in FIG. 3, the patterned photomask 150 is then stripped and a thin barrier metal layer of tantalum (Ta) 325A and a copper seed layer 325B are then applied to the entire surface using vapor-phase deposition (FIG. 3). The barrier metal layer of Ta 325A and the Cu seed layer 325B blanket-deposit an entire upper surface 330 of the second sacrificial dielectric layer 130 as well as side 340 and bottom 350 surfaces of the trench 220, forming a conductive surface 335, as shown in FIG. 3.

The barrier metal layer 325A may be formed of at least one layer of a barrier metal material, such as tantalum or tantalum nitride, and the like. For example, the barrier metal layer 325A may equivalently be formed of titanium nitride, titanium-tungsten, nitrided titanium-tungsten, magnesium, or another suitable barrier material. The copper seed layer 325B may be formed on top of the one or more barrier metal layers 325A by physical vapor deposition (PVD) or chemical vapor deposition (CVD), for example.

The bulk of the copper trench-fill is frequently done using an electroplating technique, where the conductive surface 335 is mechanically clamped to an electrode to establish an electrical contact, and the structure 100 is then immersed in an electrolyte solution containing Cu ions. An electrical current is then passed through the wafer-electrolyte system to cause reduction and deposition of Cu on the conductive surface 335. In addition, an alternating-current bias of the wafer-electrolyte system has been considered as a method of self-planarizing the deposited Cu film, similar to the deposit-etch cycling used in high-density plasma (HDP) tetraethyl orthosilicate (TEOS) dielectric depositions.

Figure 4:
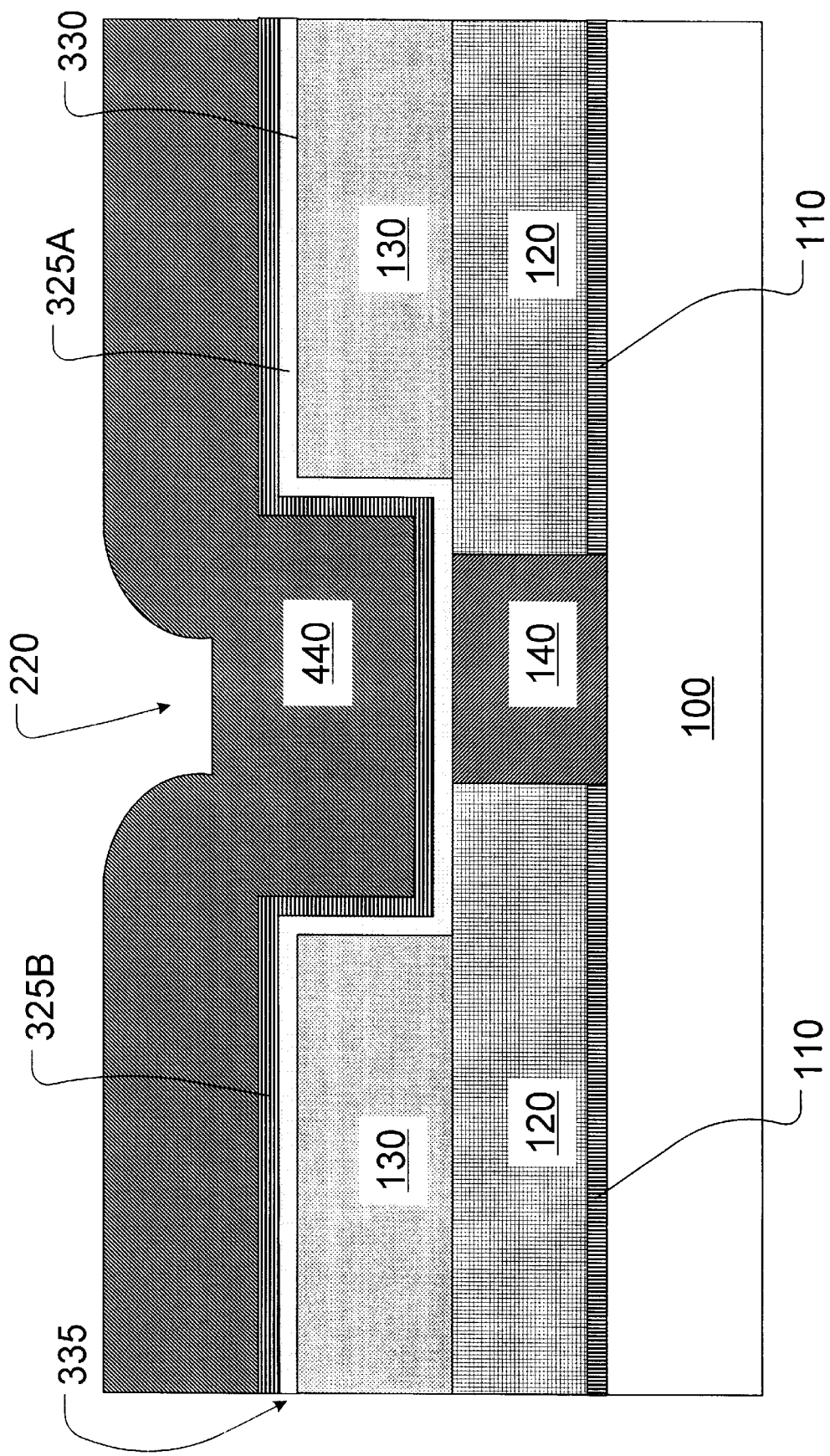
Figure 5:
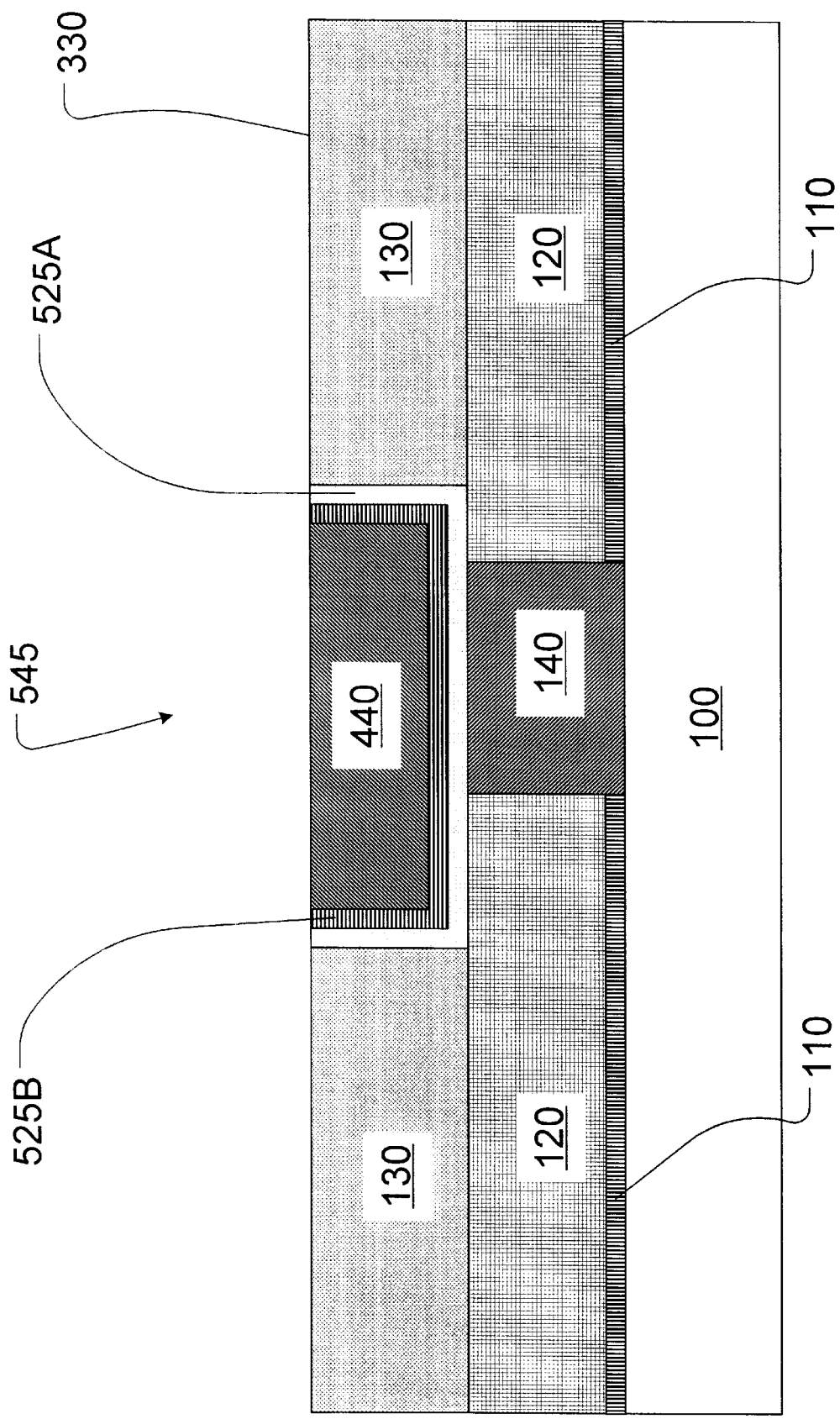

As shown in FIG. 4, this process typically produces a conformal coating of Cu 440 of substantially constant thickness across the entire conductive surface 335. As shown in FIG. 5, once a sufficiently thick layer of Cu 440 has been deposited, the layer of Cu 440 is planarized using CMP techniques. The planarization using CMP clears all Cu and Ta barrier metal from the entire upper surface 330 of the second sacrificial dielectric layer 130, leaving Cu 440 only in Cu-filled trench 545, adjacent remaining portions 525A and 525B of the one or more barrier metal layers 325A and copper seed layer 325B (FIGS. 3 and 4), respectively, as shown in FIG. 5.

Figure 6:
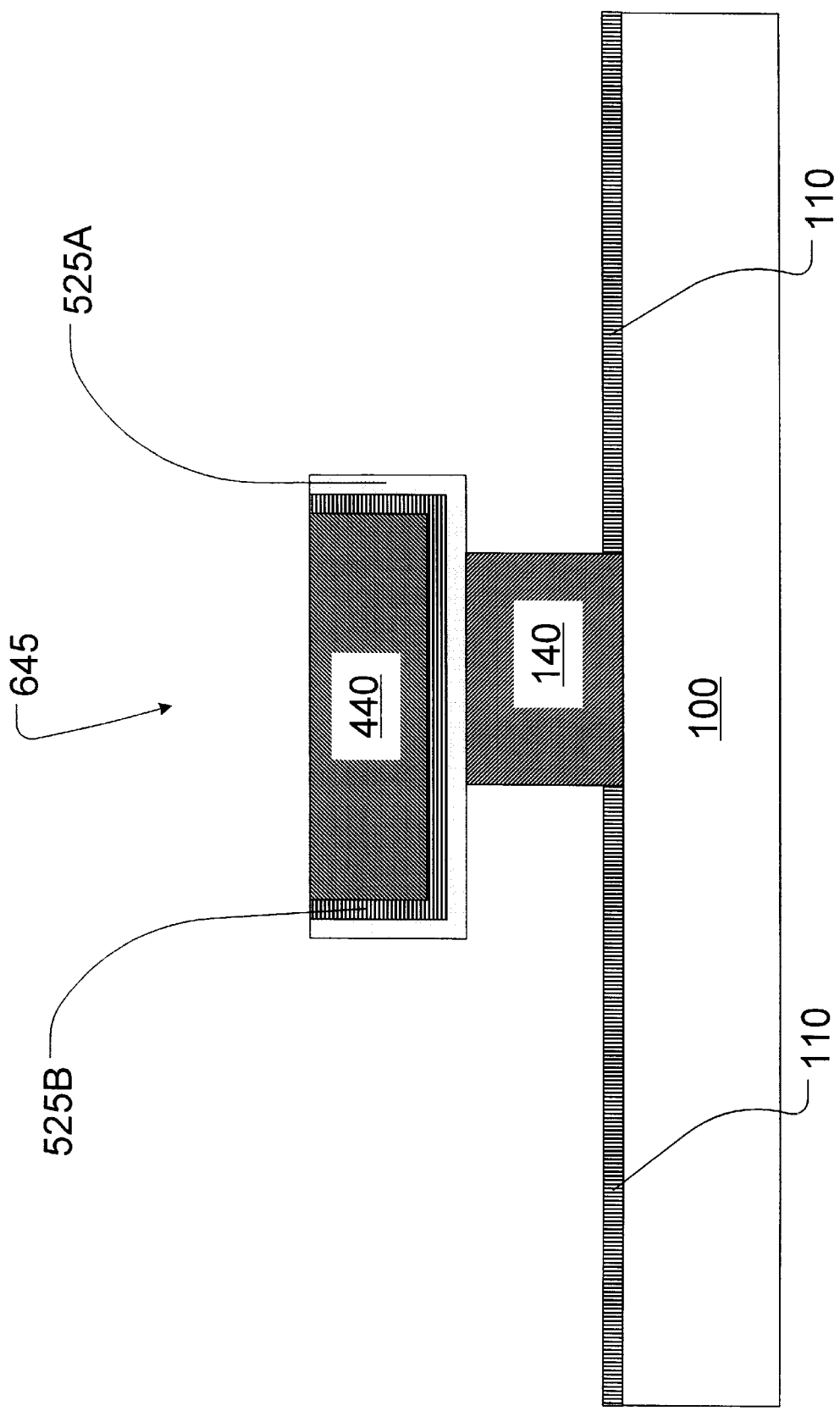

As shown in FIG. 6, the first and second sacrificial dielectric layers 120 and 130 may be removed by using a wet etch, for example, leaving a Cu-interconnect 645 remaining. The wet etch stops at the etch stop layer (ESL) 110. Dry etching and/or plasma etching may also be used, in various alternative illustrative embodiments. The first and second sacrificial dielectric layers 120 and 130 may also be selectively removed, for example, by stripping with hot phosphoric acid ($H_3PO_4$). The Cu-interconnect 645 may include the Cu 440 in the Cu-filled trench 545, adjacent the remaining portions 525A and 525B of the one or more barrier metal layers 325A and copper seed layer 325B (FIGS. 3 and 4), and the intermetal via connection 140.

Figure 7:
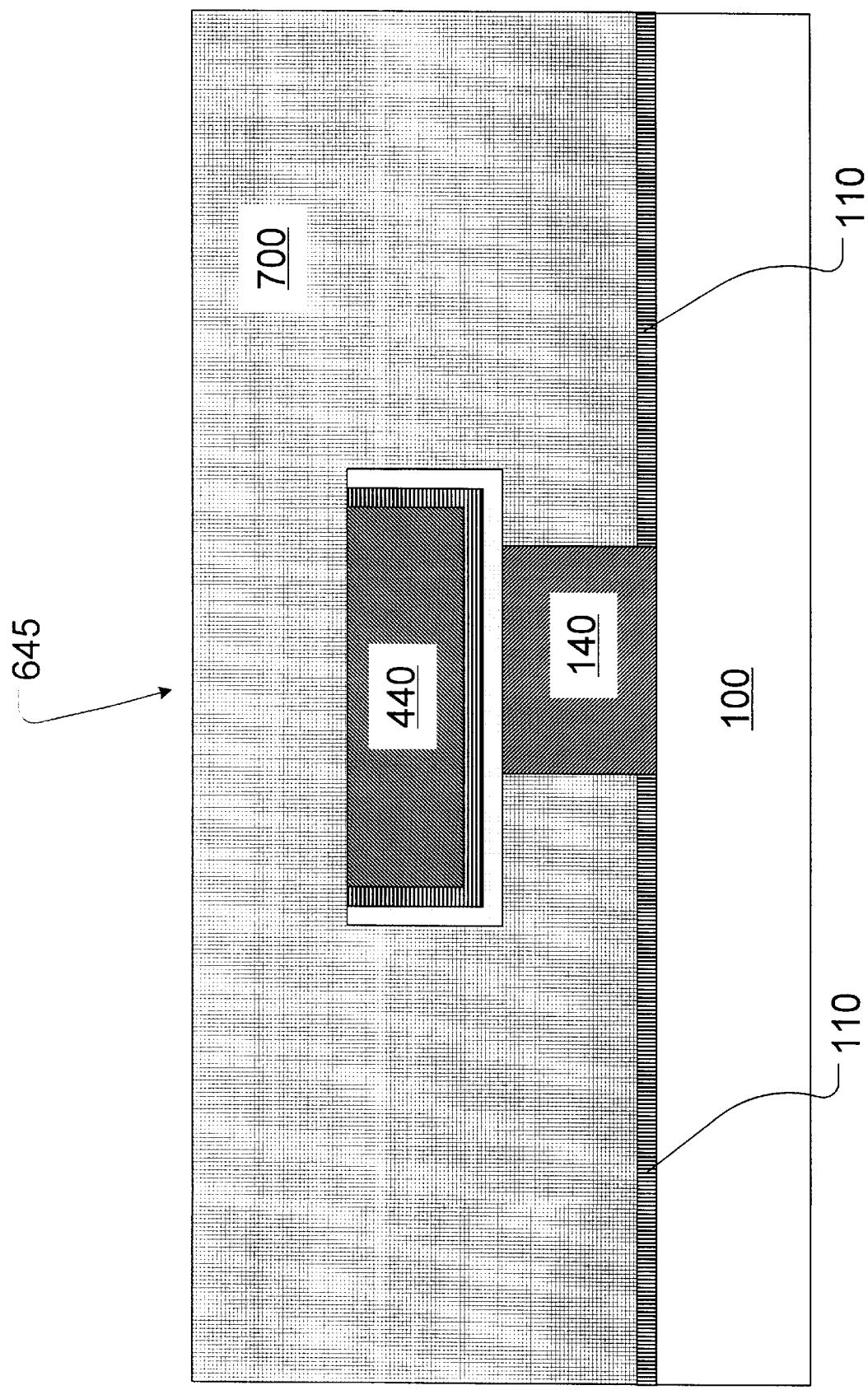

As shown in FIG. 7, a "low dielectric constant" or "low K" (K is less than or equal to about 4) dielectric layer 700 may be formed adjacent the Cu-interconnect 645 and above the ESL 110. The low K dielectric layer 700 may be formed by a variety of known techniques for forming such layers, e.g., chemical vapor deposition (CVD), low-pressure CVD (LPCVD), plasma-enhanced CVD (PECVD), sputtering, physical vapor deposition (PVD), thermal growing, and the like, and may have a thickness ranging from approximately 2000 Å–5000 Å, for example.

The low K dielectric layer 700 may be formed from a variety of low K dielectric materials, where K is less than or equal to about 4. Examples include Applied Material's Black Diamond®, Novellus' Coral®, Allied Signal's Nanoglass®, JSR's LKD5104, and the like. In one illustrative embodiment, the low K dielectric layer 700 is comprised of methylene silicon hydroxide, having a thickness of approximately 2500 Å, which is formed by being blanket-deposited by an LPCVD process for higher throughput.

Figure 8:
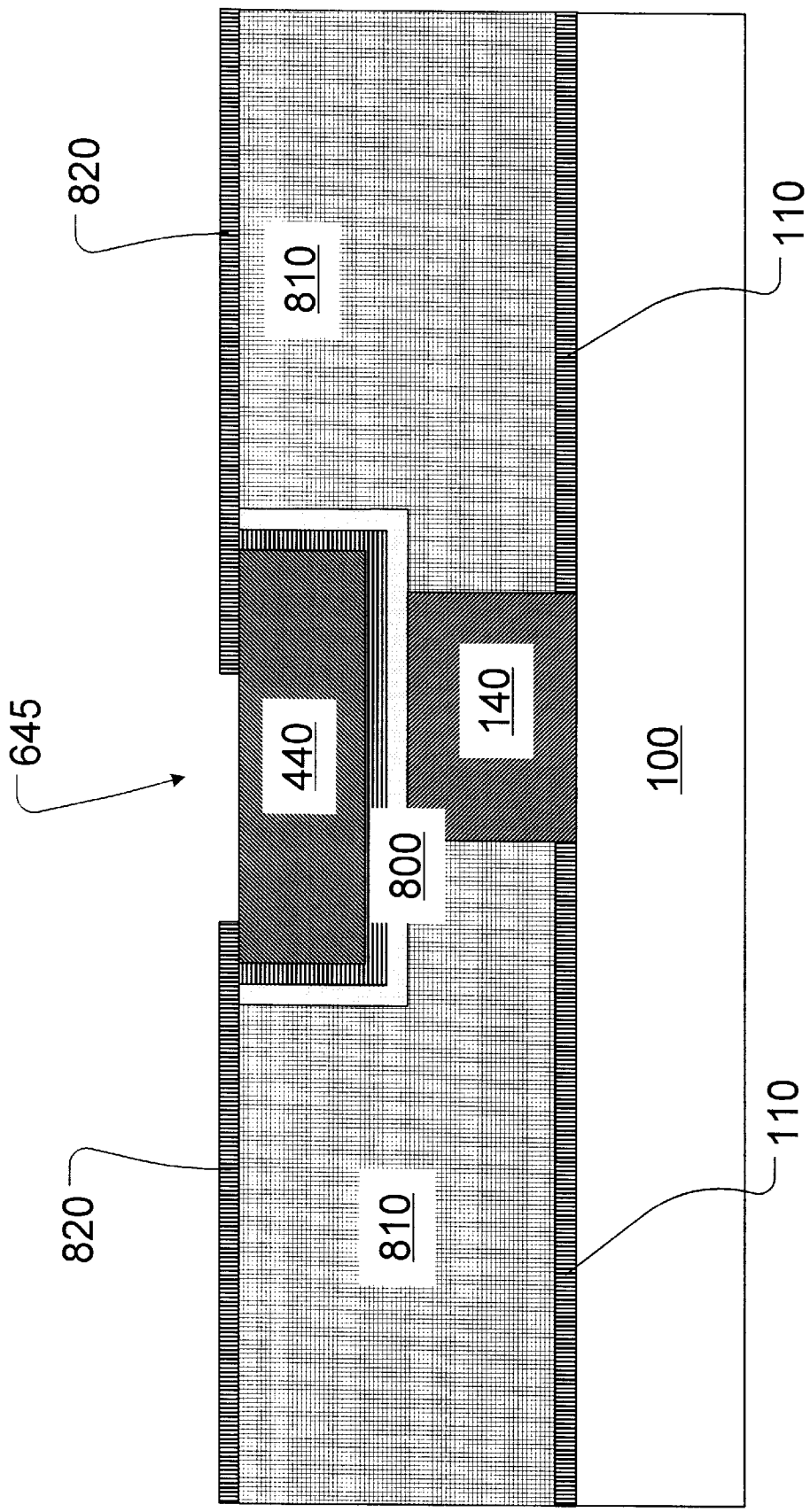

As shown in FIG. 8, the low K dielectric layer 700 is planarized using CMP techniques, forming a planarized low K dielectric layer 810. The planarization leaves the planarized low K dielectric layer 810 adjacent the Cu-interconnect 645 and above the ESL 110, forming a Cu-interconnect layer 800. The Cu-interconnect layer 800 may include the Cu-interconnect 645 adjacent the planarized low K dielectric layer 810. The Cu-interconnect layer 800 may also include the ESL 110. As shown in FIG. 8, the Cu-interconnect layer 800 may also include an ESL 820 (also known as a "hard mask" and typically formed of silicon nitride, $Si_3N_4$, or SiN, for short) formed and patterned above the planarized low K dielectric layer 810 and above at least a portion of the Cu-interconnect 645.

Figure 9:
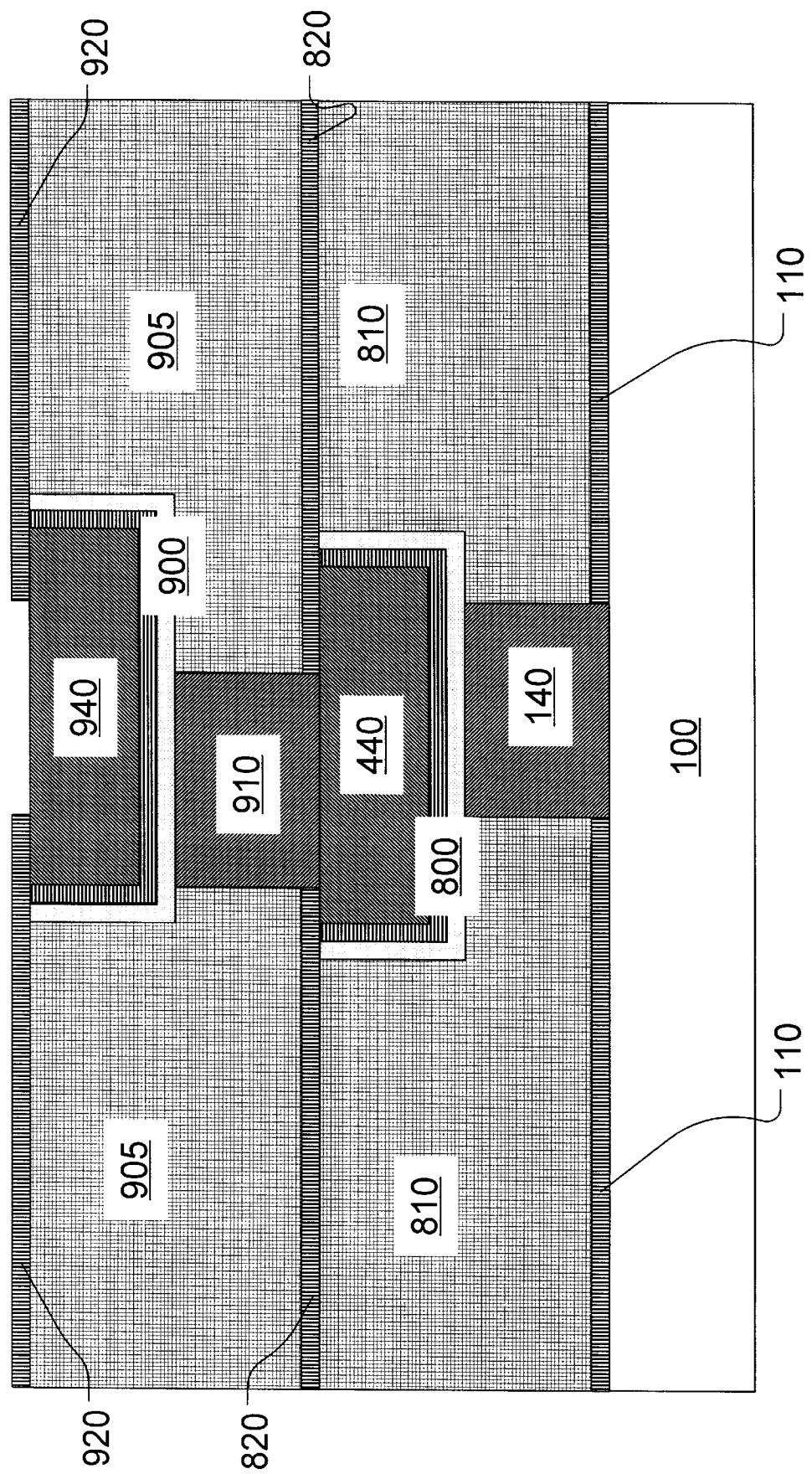
FIG. 9 schematically illustrates multiple layers of copper interconnects according to various embodiments of the present invention.

As shown in FIG. 9, the Cu-interconnect layer 800 may be an underlying structure layer (similar to the structure 100) to a Cu-interconnect layer 900. The Cu-interconnect layer 900 may include a Cu-filled trench 940 and an intermetal via connection 910 adjacent a planarized low K dielectric layer 905. The Cu-interconnect layer 900 may also include the ESL 820 and/or an ESL 920 (also known as a "hard mask" and typically formed of silicon nitride, $Si_3N_4$, or SiN, for short) formed and patterned above the planarized low K dielectric layer 905 and above at least a portion of the Cu-filled trench 940.

Figure 10:
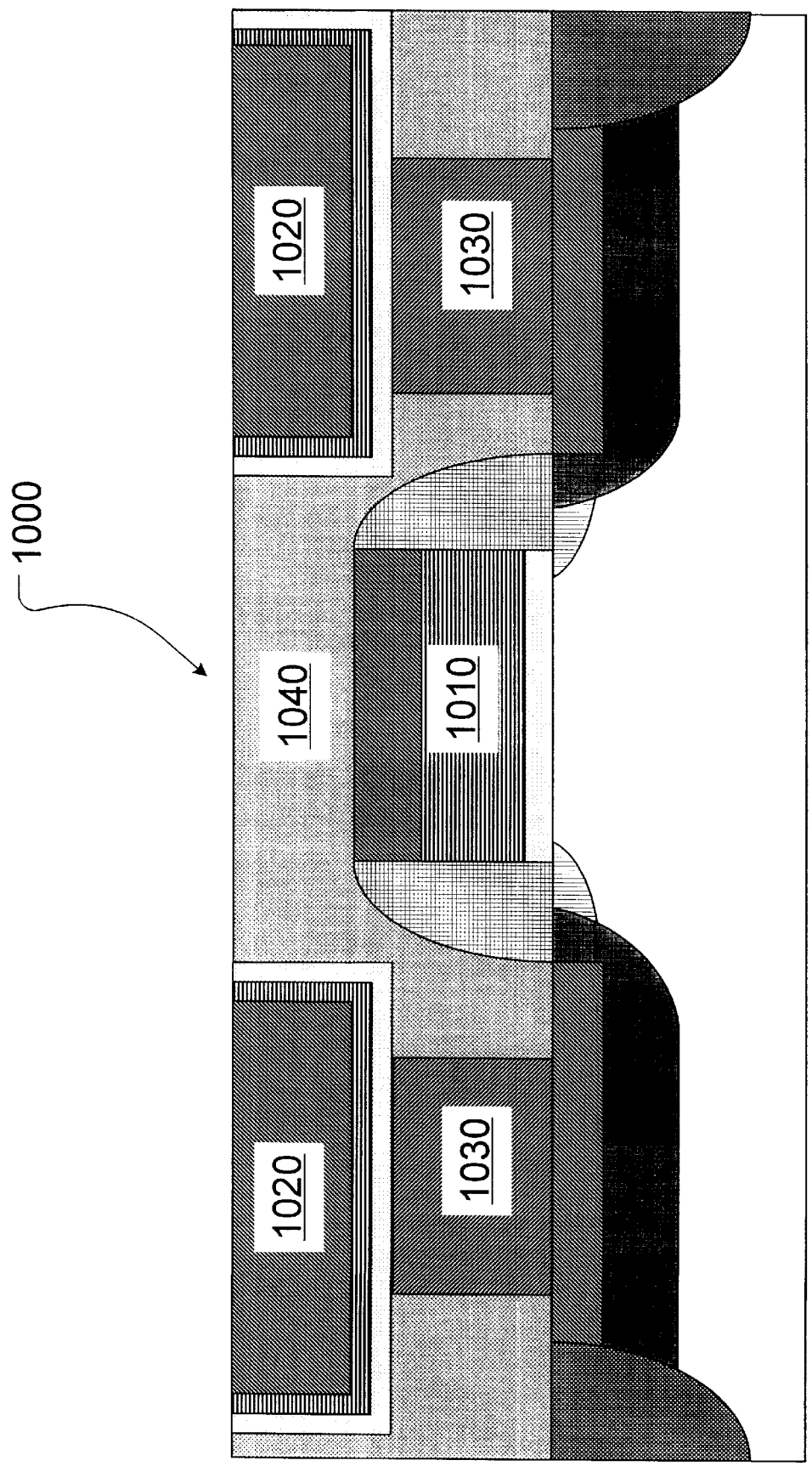
FIG. 10 schematically illustrates copper interconnects according to various embodiments of the present invention connecting source/drain regions of an MOS transistor.

As shown in FIG. 10, an MOS transistor 1010 may be an underlying structure layer (similar to the structure 100) to a Cu-interconnect layer 1000. The Cu-interconnect layer 1000 ay include Cu-filled trenches 1020 and intermetal via connections 1030 adjacent a planarized low K dielectric layer 1040.

Figure 11:
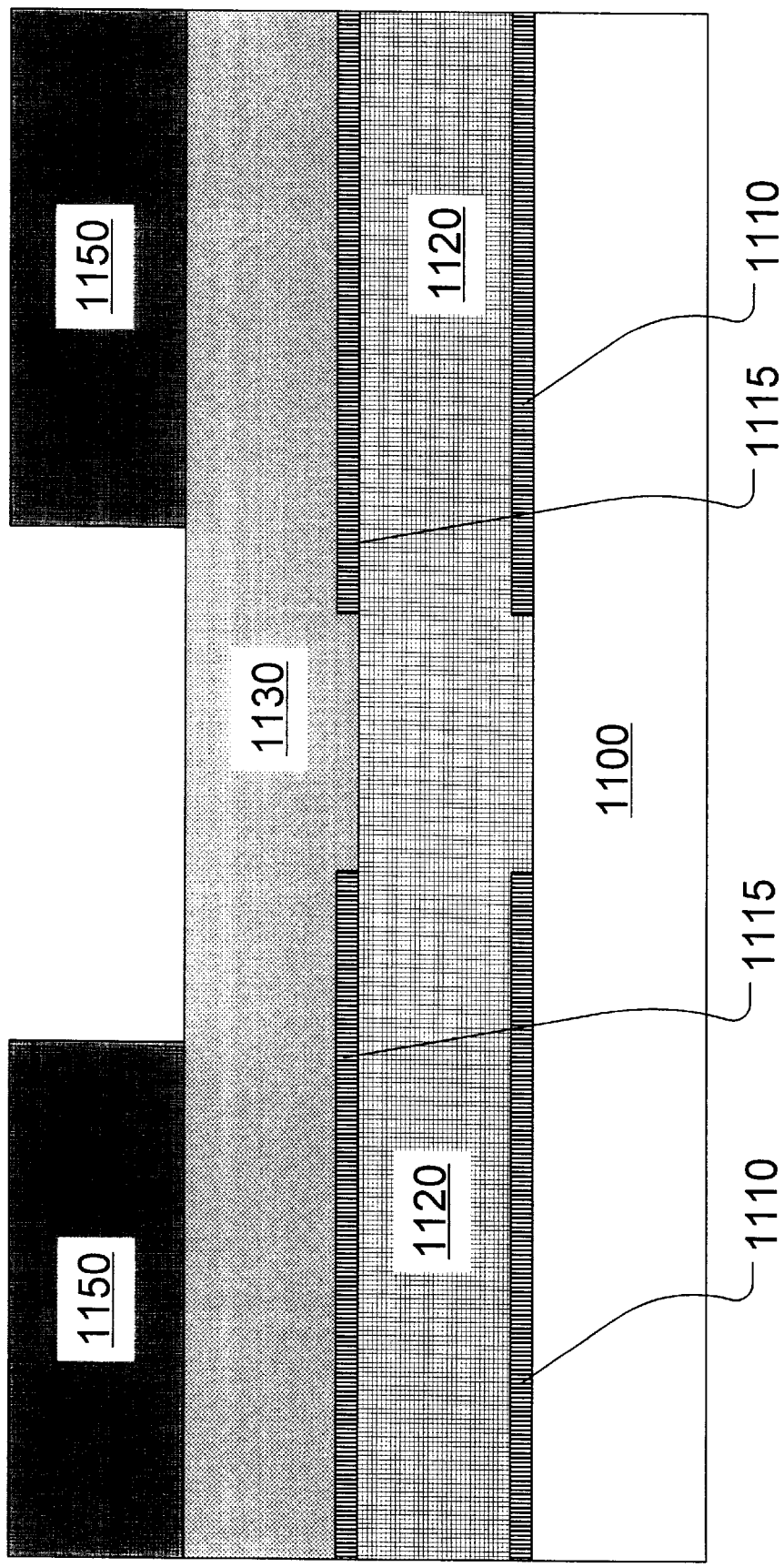
FIGS. 11–18 schematically illustrate a dualdamascene copper interconnect process flow according to various embodiments of the present invention.

As shown in FIG. 11, a first etch stop layer (ESL) 1110 (typically silicon nitride, $Si_3N_4$, or SiN, for short) and a first sacrificial dielectric layer 1120 may be formed above a structure 1100 such as a semiconducting substrate. However, the present invention is not limited to the formation of a Cu-based interconnect above the surface of a semiconducting substrate such as a silicon wafer, for example. Rather, as will be apparent to one skilled in the art upon a complete reading of the present disclosure, a Cu-based interconnect formed in accordance with the present invention may be formed above previously formed semiconductor devices and/or process layer, eg, transistors, or other similar structure. In effect, the present invention may be used to form process layers on top of previously formed process layers. The structure 1100 may be an underlayer of semiconducting material, such as a silicon substrate or wafer, or, alternatively, may be an underlayer of semiconductor devices (see FIG. 20, for example), such as a layer of metal oxide semiconductor field effect transistors (MOSFETs), and the like, and/or a metal interconnection layer or layers (see FIG. 19, for example) and/or an interlayer dielectric (ILD) layer or layers, and the like.

In a dual-damascene copper process flow, according to various embodiments of the present invention, as shown in FIGS. 11–18, a first sacrificial dielectric layer 1120 is formed above the structure 1100, above the first ESL 1110. A second sacrificial dielectric layer 1130 is formed above the first sacrificial dielectric layer 1120 and above a second ESL 1115. As will be described in more detail below in conjunction with FIG. 12, the first ESL 1110 and the second ESL 1115 define a lower (via) portion of the copper interconnect formed in the dual-damascene copper process flow. The structure 1100 has the first ESL 1110 (also known as a "hard mask" and typically formed of silicon nitride, $Si_3N_4$, or SiN, for short) formed and patterned thereon, between the structure 1100 and the first sacrificial dielectric layer 1120. Similarly, the first sacrificial dielectric layer 1120 has the second ESL 1115 (also typically formed of SiN) formed and patterned thereon, between the first sacrificial dielectric layer 1120 and the second sacrificial dielectric layer 1130. If necessary, the second sacrificial dielectric layer 1130 may be planarized using chemical-mechanical planarization (CMP).

The first and second sacrificial dielectric layers 1120 and 1130 may be formed from a variety of dielectric materials and one or both may, for example, be an oxide (e.g. Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The first and second sacrificial dielectric layers 1120 and 1130 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3$/$SrTiO_3$), and the like.

The first and second sacrificial dielectric layers 1120 and 1130 may be formed by a variety of known techniques for forming such layers, e.g., chemical vapor deposition (CVD), low-pressure CVD (LPCVD), plasma-enhanced CVD (PECVD), sputtering, physical vapor deposition (PVD), thermal growing, and the like. The first and second sacrificial dielectric layers 1120 and 1130 may each have thicknesses in a range of about 1000–2500 Å. In one illustrative embodiment, the first and second sacrificial dielectric layers 1120 and 1130 are each comprised of silicon dioxide ($SiO_2$) having a thickness of approximately 1000 Å, formed by being blanket-deposited by LPCVD process for higher throughput.

Figure 12:
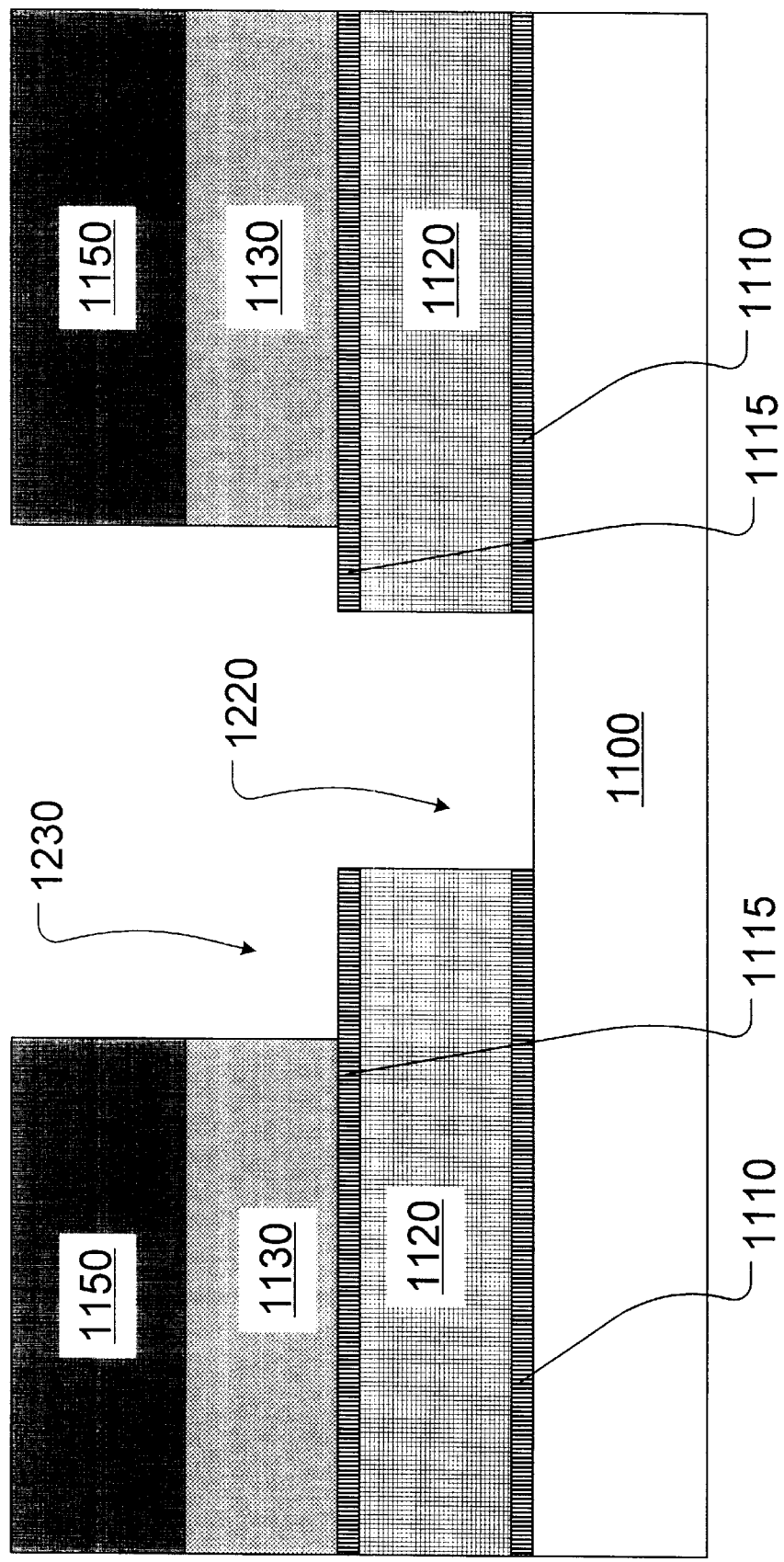

As shown in FIG. 12, a metallization pattern is then formed by using a patterned photomask 1150 (FIGS. 11–12) and photolithography. For example, first and second openings, such as via 1220 and trench 1230, for conductive metal lines, contact holes, via holes, and the like, are etched into first and second sacrificial dielectric layers 1120 and 1130, respectively (FIG. 12). The first and second openings 1220 and 1230 may be formed by using a variety of known anisotropic etching techniques, such as a reactive ion etching (RIE) process using hydrogen bromide (HBr) and argon (Ar) as the etchant gases, for example. Alternatively, an RIE process with $CHF_3$ and Ar as the etchant gases may be used, for example. Dry etching may also be used, in various illustrative embodiments.

Figure 13:
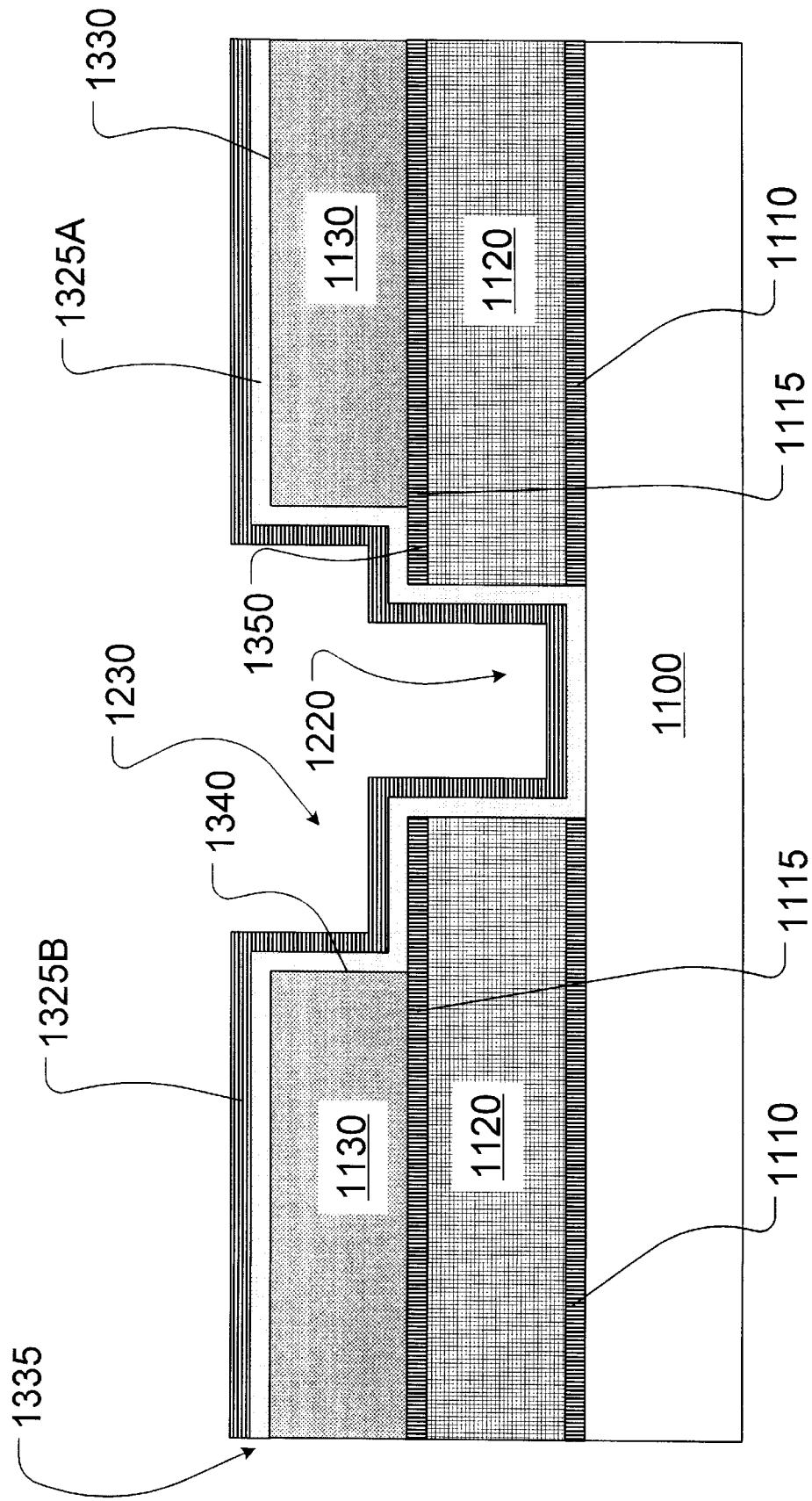

As shown in FIG. 13, the patterned photomask 1150 is then stripped and a thin barrier metal layer of tantalum (Ta) 1325A and a copper seed layer 1325B are then applied to the entire surface using vapor-phase deposition (FIG. 13). The barrier metal layer of Ta 1325A and the Cu seed layer 1325B blanket-deposit the entire upper surface 1330 of the second sacrificial dielectric layer 1130 as well as the side 1340 and bottom 1350 surfaces of the first and second openings 1220 and 1230 forming a conductive surface 1335, as shown in FIG. 13.

The barrier metal layer 1325A may be formed of at least one layer of a barrier metal material, such as tantalum or tantalum nitride, and the like. For example, the barrier metal layer 1325A may equivalently be formed of titanium nitride, titanium-tungsten, nitrided titanium-tungsten, magnesium, or another suitable barrier material. The copper seed layer 1325B may be formed on top of the one or more barrier metal layers 1325A by physical vapor deposition (PVD) or chemical vapor deposition (CVD), for example.

The bulk of the copper trench-fill is frequently done using an electroplating technique, where the conductive surface 1335 is mechanically clamped to an electrode to establish an electrical contact, and the structure 1100 is then immersed in an electrolyte solution containing Cu ions. An electrical current is then passed through the wafer-electrolyte system to cause reduction and deposition of Cu on the conductive surface 1335. In addition, an alternating-current bias of the wafer-electrolyte system has been considered as a method of self-planarizing the deposited Cu film, similar to the deposit-etch cycling used in high-density plasma (HDP) tetraethyl orthosilicate (TEOS) dielectric depositions.

Figure 14:
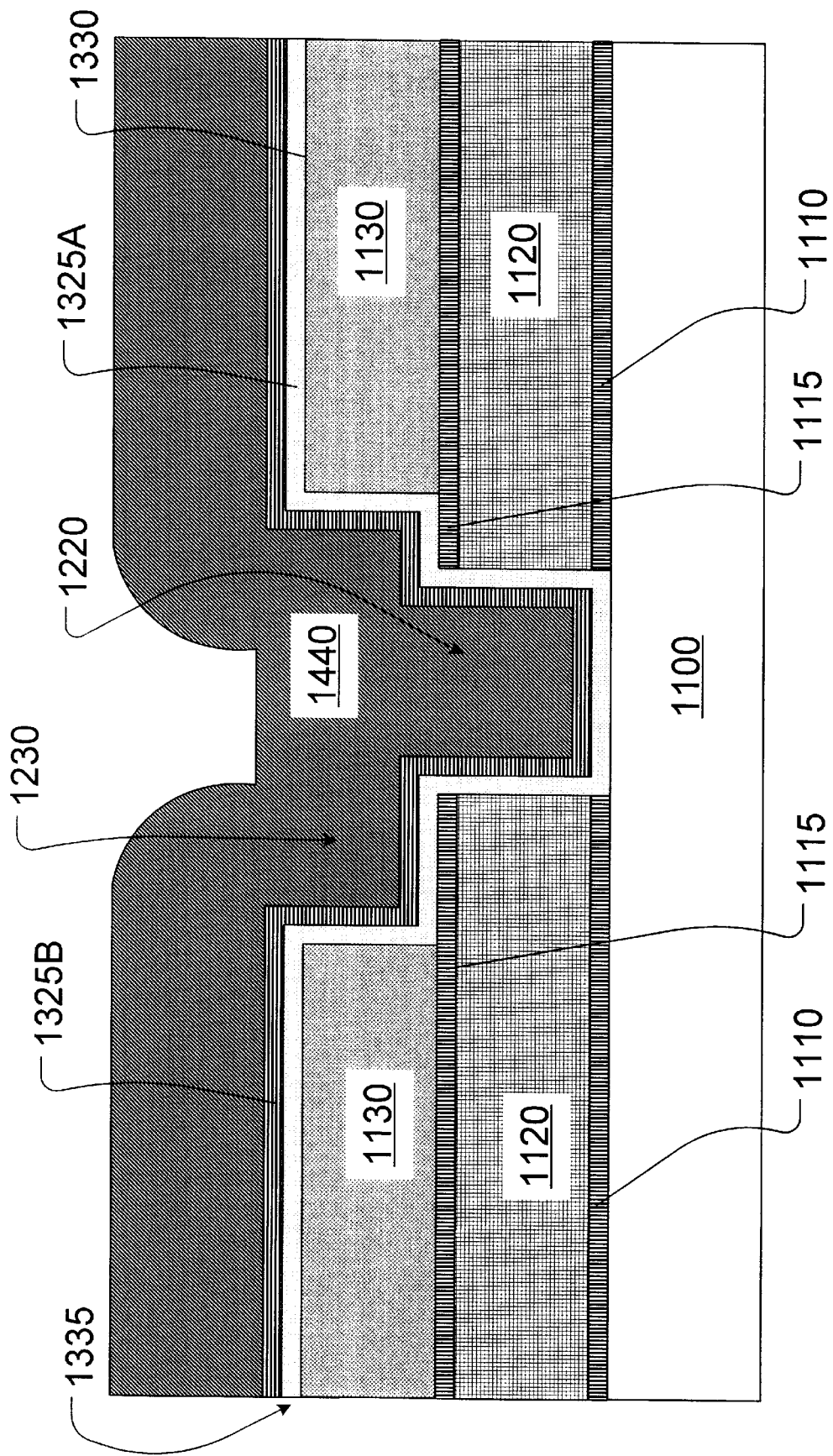
Figure 15:
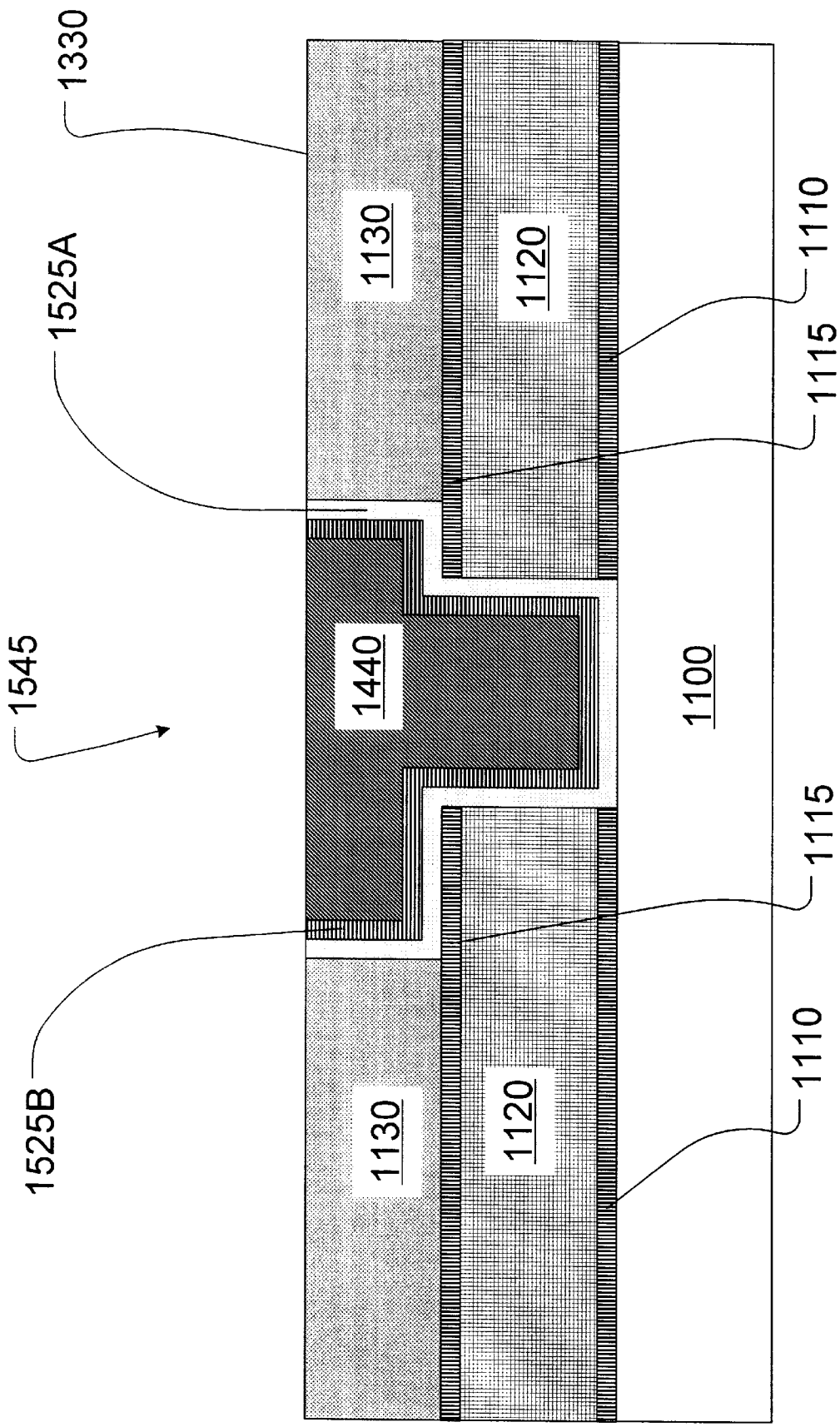

As shown in FIG. 14, this process typically produces a conformal coating of Cu 1440 of substantially constant thickness across the entire conductive surface 1335. As shown in FIG. 15, once a sufficiently thick layer of Cu 1440 has been deposited, the layer of Cu 1440 is planarized using CMP techniques. The planarization using CMP clears all Cu and Ta barrier metal from the entire upper surface 1330 of the second sacrificial dielectric layer 1130, leaving Cu 1440 only in Cu-filled trench and via 1545, adjacent remaining portions 1525A and 1525B of the one or more barrier metal layers 1325A and copper seed layer 1325B (FIGS. 13 and 14), respectively, as shown in FIG. 15.

Figure 16:
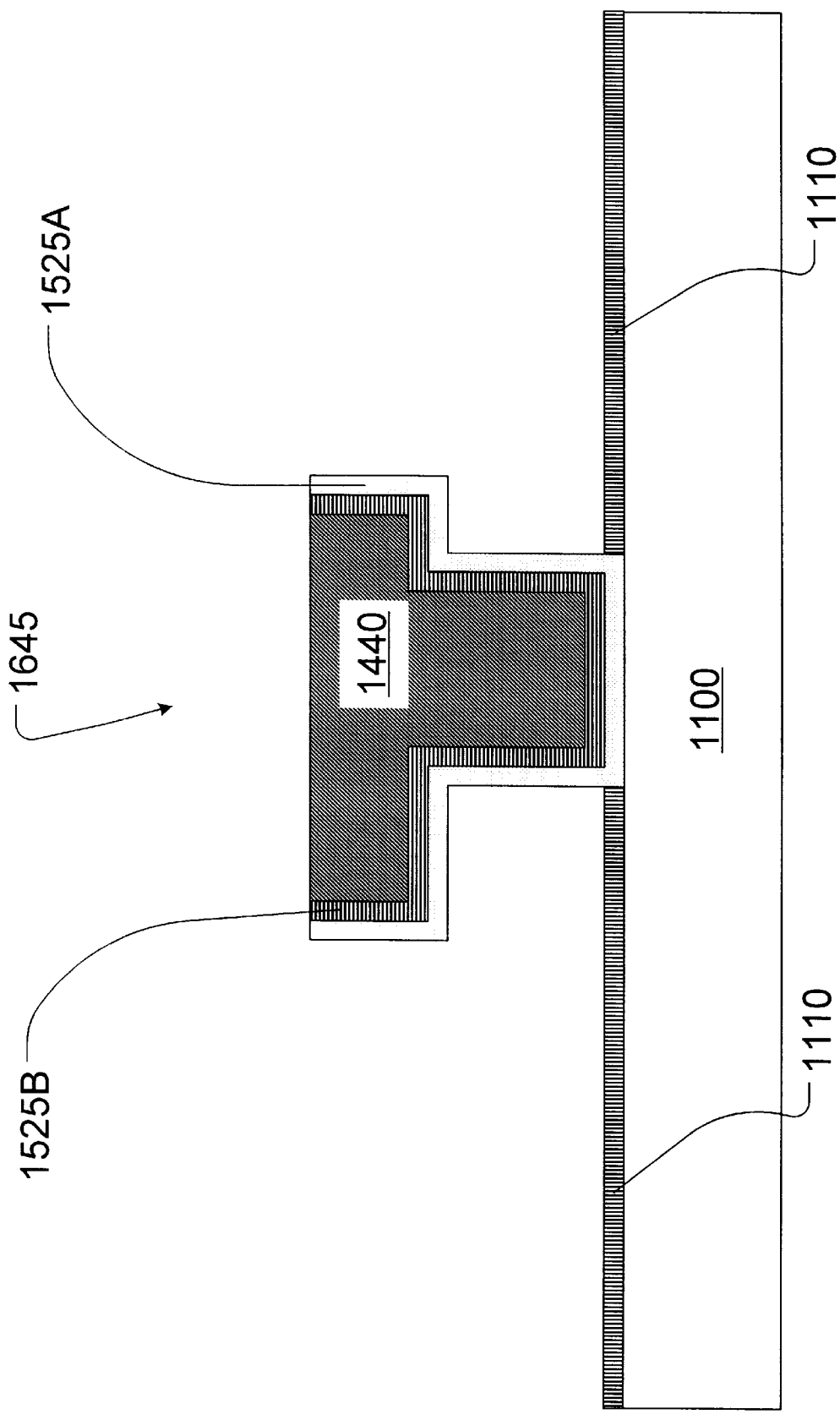

As shown in FIG. 16, the first and second sacrificial dielectric layers 1120 and 1130 may be removed by using a wet etch, for example, leaving the Cu-interconnect 1645 remaining. The wet etch stops at the first etch stop layer (ESL) 1110. Dry etching and/or plasma etching may also be used, in various alternative illustrative embodiments. The first and second sacrificial dielectric layers 1120 and 1130 may also be selectively removed, for example, by stripping with hot phosphoric acid ($H_3PO_4$). The Cu-interconnect 1645 may include the Cu 1440 in the Cu-filled trench and via 1545, adjacent the remaining portions 1525A and 1525B of the one or more barrier metal layers 1325A and copper seed layer 1325B (FIGS. 13 and 14).

Figure 17:
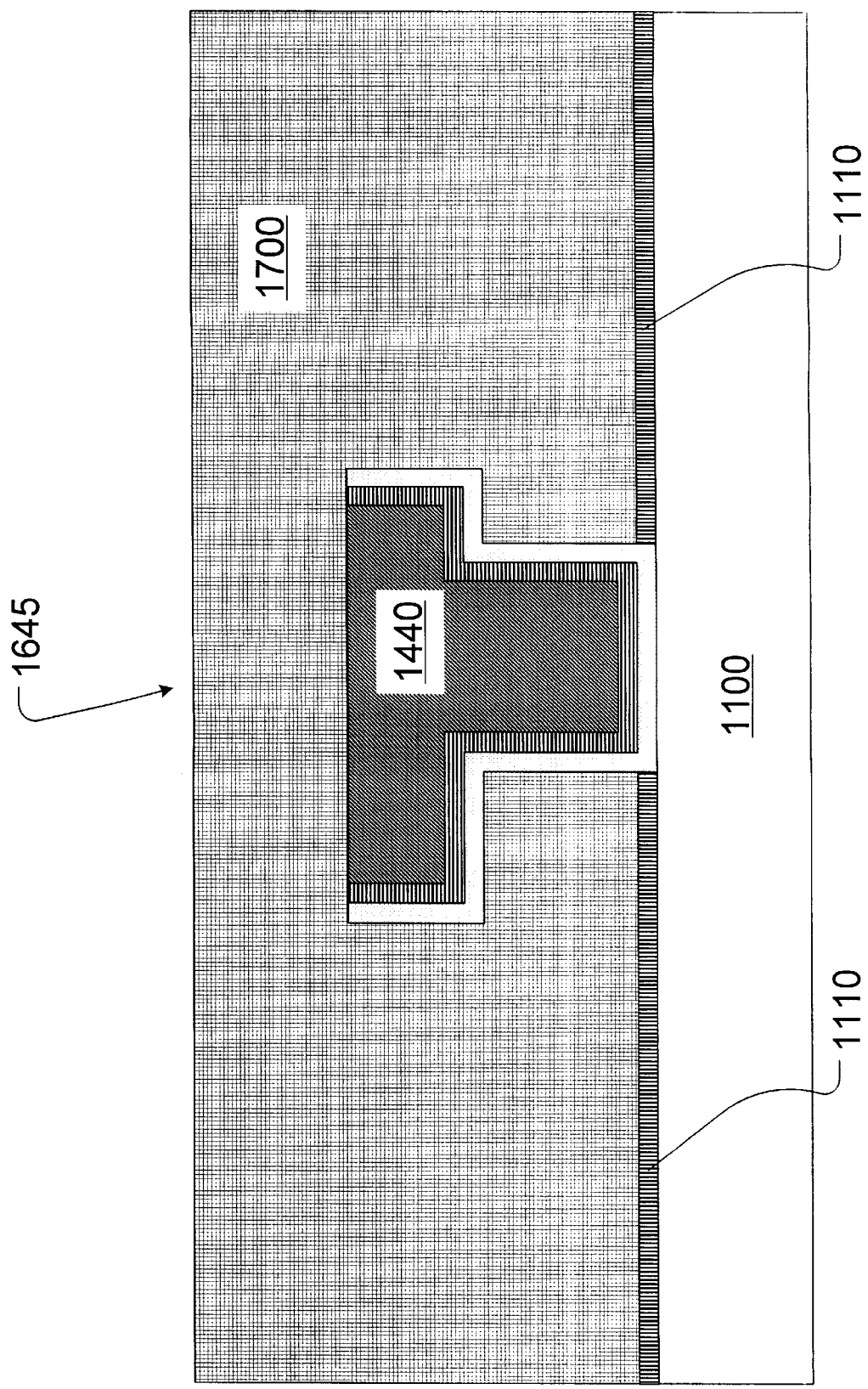

As shown in FIG. 17, a "low dielectric constant" or "low K" (K is less than or equal to about 4) dielectric layer 1700 may be formed adjacent the Cu-interconnect 1645 and above the first ESL 1110. The low K dielectric layer 1700 may be formed by a variety of known techniques for forming such layers, e.g., chemical vapor deposition (CVD), low-pressure CVD (LPCVD), plasma-enhanced CVD (PECVD), sputtering, physical vapor deposition (PVD), thermal growing, and the like, and may have a thickness ranging from approximately 2000 Å–5000 Å, for example.

The low K dielectric layer 1700 may be formed from a variety of low K dielectric materials, where K is less than or equal to about 4. Examples include Applied Material's Black Diamond®, Novellus' Coral®, Allied Signal's Nanoglass®, JSR's LKD5104, and the like. In one illustrative embodiment, the low K dielectric layer 1700 is comprised of methylene silicon hydroxide, having a thickness of approximately 2500 Å, which is formed by being blanket-deposited by an LPCVD process for higher throughput.

Figure 18:
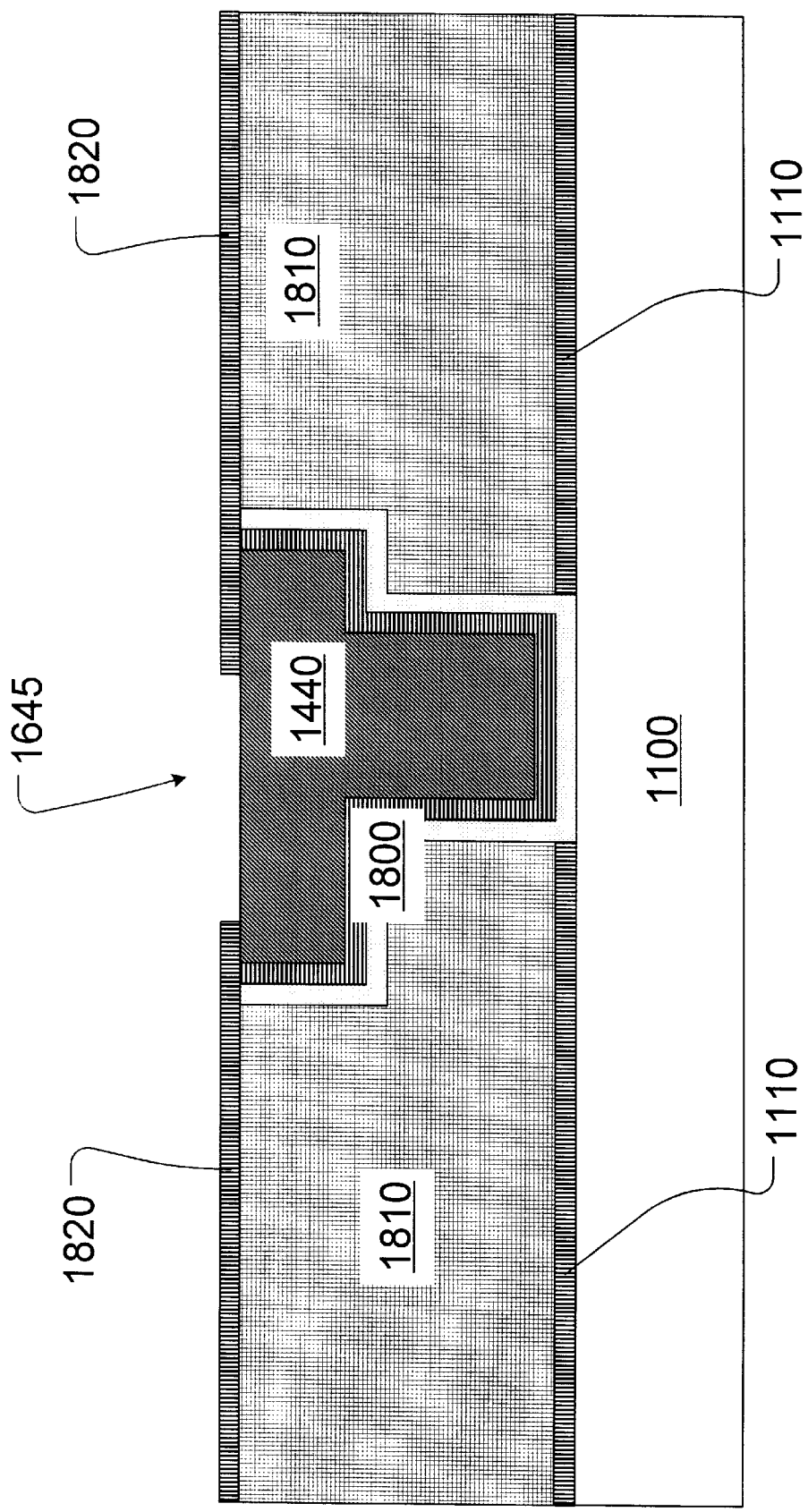

As shown in FIG. 18, the low K dielectric layer 1700 is planarized using CMP techniques, forming a planarized low K dielectric layer 1810. The planarization leaves the planarized low K dielectric layer 1810 adjacent the Cu-interconnect 1645 and above the first ESL 1110, forming a Cu-interconnect layer 1800. The Cu-interconnect layer 1800 may include the Cu-interconnect 1645 adjacent the planarized low K dielectric layer 1810. The Cu-interconnect layer 1800 may also include the first ESL 1110. As shown in FIG. 18, the Cu-interconnect layer 1800 may also include a third ESL 1820 (also known as a "hard mask" and typically formed of silicon nitride, $Si_3N_4$, or SiN, for short) formed and patterned above the planarized low K dielectric layer 1810 and above at least a portion of the Cu-interconnect 1645.

Figure 19:
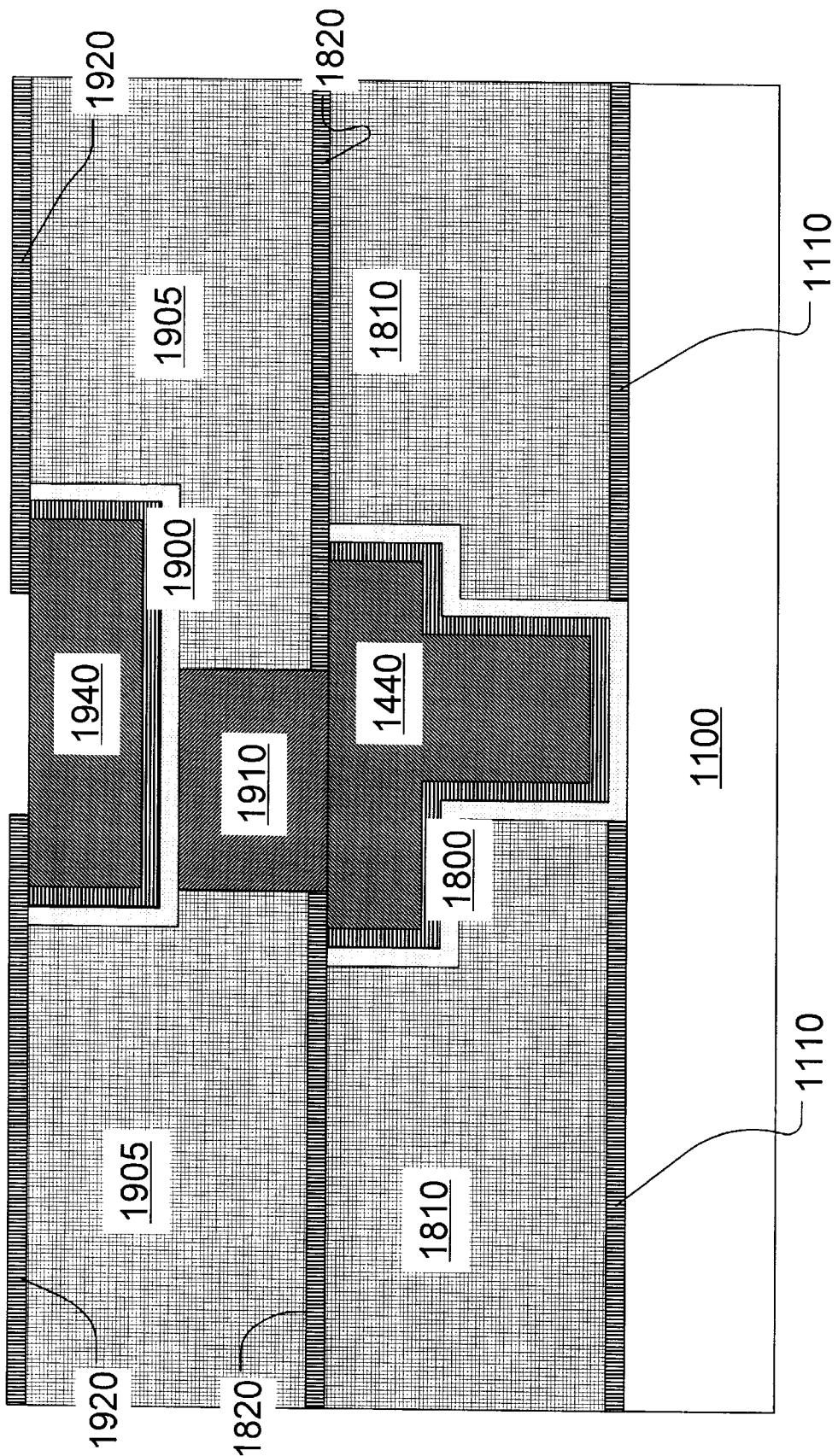
FIG. 19 schematically illustrates multiple layers of copper interconnects according to various embodiments of the present invention.

As shown in FIG. 19, the Cu-interconnect layer 1800 may be an underlying structure layer (similar to the structure 1100) to a Cu-interconnect layer 1900. The Cu-interconnect layer 1900 may include a Cu-filled trench 1940 and an intermetal via connection 1910 adjacent a planarized low K dielectric layer 1905. The Cu-interconnect layer 1900 may also include the third ESL 1820 and/or a fourth ESL 1920 (also known as a "hard mask" and typically formed of silicon nitride, $Si_3N_4$, or SiN, for short) formed and patterned above the planarized low K dielectric layer 1905 and above at least a portion of the Cu-filled trench 1940. Alternatively, the Cu-interconnect layer 1900 may be similar to the Cu-interconnect layer 1800, having a Cu-interconnect disposed therein that is similar to the Cu-interconnect 1645, for example.

Figure 20:
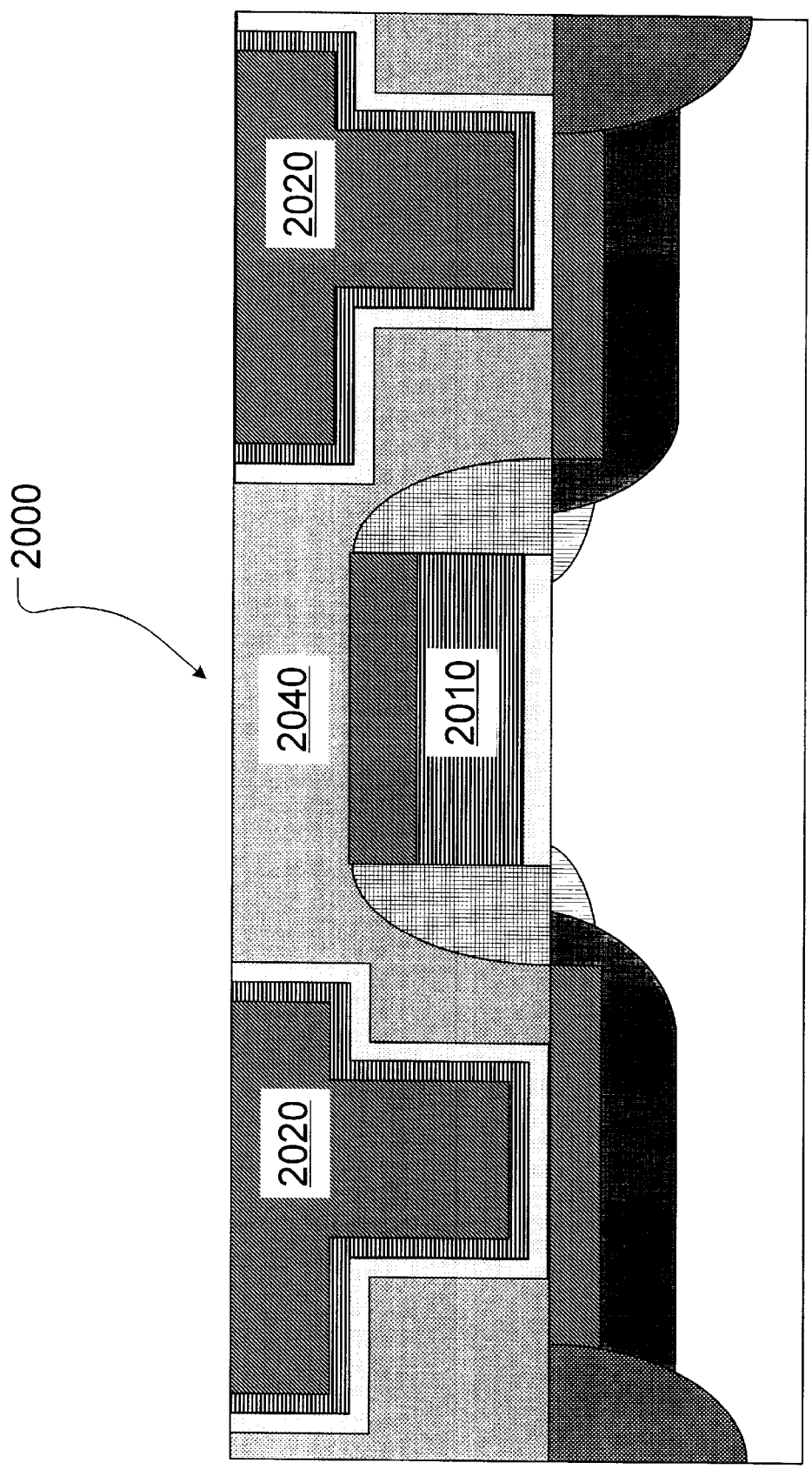
FIG. 20 schematically illustrates copper interconnects according to various embodiments of the present invention connecting source/drain regions of an MOS transistor.

As shown in FIG. 20, an MOS transistor 2010 may be an underlying structure layer (similar to the structure 1100) to a Cu-interconnect layer 1000. The Cu-interconnect layer 1000 may include Cu-filled trenches and vias 2020 adjacent a planarized low K dielectric layer 2040.

The dual-damascene copper process flow according to various embodiments of the present invention, as shown in FIGS. 11–18, combines the intermetal via connection formation with the Cu trench-fill formation by etching a more complex pattern before the formation of the barrier metal layer and Cu seed layer and before the Cu trench-fill. The trench etching continues until the via hole (such as the first opening 1220 in FIG. 12) has been etched out. The rest of the dual-damascene copper process flow according to various embodiments of the present invention, as shown in FIGS. 13–18, is essentially identical with the corresponding single-damascene copper process flow according to various embodiments of the present invention, as shown in FIGS. 3–8. Overall, however, the dual-damascene copper process flow according to various embodiments of the present invention significantly reduces the number of processing steps and is a preferred method of achieving Cu-metallization.

Any of the above-disclosed embodiments of a method of forming a copper interconnect enables a copper interconnect to be formed using conventional damascene techniques in conjunction with sacrificial dielectric materials that are far more robust than the conventional low K materials typically used in conventional damascene techniques. The sacrificial dielectric materials are far less susceptible to damage during the etching and subsequent processing steps of the conventional damascene techniques than are the conventional low K materials. By removing the sacrificial dielectric materials after the copper interconnect has been formed and then forming a low K dielectric layer adjacent the copper interconnect, all of the advantages of using a low K dielectric layer to reduce the capacitance and RC delays between adjacent copper interconnects are retained, without any of the difficulties of forming the copper interconnect using a low K dielectric during the conventional damascene processing.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming a copper interconnect, the method comprising:

forming a first sacrificial dielectric layer above a structure layer;

forming an etch stop layer above the first sacrificial dielectric layer, the etch stop layer having an etch stop opening formed therein;

forming a second sacrificial dielectric layer above the first sacrificial dielectric layer and above the etch stop layer;

forming a first opening in the first sacrificial dielectric layer and a second opening in the second sacrificial dielectric layer;

forming a copper layer above the first and second sacrificial dielectric layers and in the first and second openings;

forming the copper interconnect by removing portions of the copper layer above the second sacrificial dielectric layer, leaving the copper interconnect in the first and second openings;

removing the first and second sacrificial dielectric layers above the structure layer and adjacent the copper interconnect; and forming a low dielectric constant dielectric layer above the structure layer and adjacent the copper interconnect.

2. The method of claim 1, further comprising:
   planarizing the low dielectric constant dielectric layer.

3. The method of claim 1, wherein forming the low dielectric constant dielectric layer includes forming the low dielectric constant dielectric layer out of a low dielectric constant (low K) dielectric material, having a dielectric constant K of at most about four.

4. The method of claim 1, further comprising:
   forming and patterning a mask layer above the low dielectric constant dielectric layer to have a mask layer opening above at least a portion of the copper interconnect.

5. The method of claim 1, wherein forming the low dielectric constant dielectric layer includes forming the low dielectric constant dielectric layer using one of chemical vapor deposition (CVD), low-pressure CVD (LPCVD), plasma-enhanced CVD (PECVD), sputtering, physical vapor deposition (PVD), and spin-on-glass.

6. The method of claim 1, wherein forming the first and second sacrificial dielectric layers includes forming the first and second sacrificial dielectric layers out of at least one of an oxide, an oxynitride, silicon dioxide, a nitrogen-bearing oxide, a nitrogen-doped oxide, silicon oxynitride, a high dielectric constant (high K), where K is at least about 8, titanium oxide, tantalum oxide, barium strontium titanate, and forming the first and second sacrificial dielectric layers using at least one of chemical vapor deposition (CVD), low-pressure CVD (LPCVD), plasma-enhanced CVD (PECVD), sputtering, physical vapor deposition (PVD), and thermal growing.

7. The method of claim 1, wherein forming the first and second openings in the first and second sacrificial dielectric layers includes forming the first and second openings in the first and second sacrificial dielectric layers using the etch stop layer and a mask of photoresist, respectively, the etch stop layer and the mask of photoresist being formed and patterned above the first and second sacrificial dielectric layers, respectively.

8. The method of claim 7, wherein using the mask of photoresist and the etch stop layer includes using at least one etch stop layer formed of silicon nitride.

9. The method of claim 1, wherein forming the copper layer includes forming the copper layer using electrochemical deposition of copper.

10. The method of claim 9, wherein using the electrochemical deposition of the copper includes forming at least one barrier layer and a copper seed layer in the second opening before the electrochemical deposition of the copper, and removing the portions of the copper layer includes planarizing the copper using chemical mechanical polishing after the electrochemical deposition of the copper.

11. A method of forming a copper interconnect, the method comprising:

forming a first sacrificial dielectric layer above a structure layer;

forming an etch stop layer above the first sacrificial dielectric layer, the etch stop layer having an etch stop opening formed therein;

forming a second sacrificial dielectric layer above the first sacrificial dielectric layer and above the etch stop layer;

forming a first opening in the first sacrificial dielectric layer and a second opening in the second sacrificial dielectric layer;

forming at least one barrier metal layer and a copper seed layer above the first and second sacrificial dielectric layers and in the first and second openings;

electrochemically depositing copper above the copper seed layer above the at least one barrier metal layer;

forming the copper interconnect by removing the copper and the at least one barrier metal layer and the copper seed layer above the second sacrificial dielectric layer, leaving the copper interconnect in the first and second openings;

removing the first and second sacrificial dielectric layers above the structure layer and adjacent the copper interconnect; and forming a low dielectric constant dielectric layer above the structure layer and adjacent the copper interconnect.

12. The method of claim 11, further comprising:

planarizing the low dielectric constant dielectric layer.

13. The method of claim 11, wherein forming the low dielectric constant dielectric layer includes forming the low dielectric constant dielectric layer out of a low dielectric constant (low K) dielectric material, having a dielectric constant K of at most about four.

14. The method of claim 11, further comprising:

forming and patterning a mask layer above the low dielectric constant dielectric layer to have a mask layer opening above at least a portion of the copper interconnect.

15. The method of claim 11, wherein forming the low dielectric constant dielectric layer includes forming the low dielectric constant dielectric layer using one of chemical vapor depostion (CVD), low-pressure CVD (LPCVD), plasma-enhanced CVD (PECVD), sputtering, physical vapor deposition (PVD), and spin-on-glass.

16. The method of claim 11, wherein forming the first and second sacrificial dielectric layers includes forming the first and second sacrificial dielectric layers out of at least one of an oxide, an oxynitride, silicon dioxide, a nitrogen-bearing oxide, a nitrogen-doped oxide, silicon oxynitride, a high dielectric constant (high K), where K is at least about 8, titanium oxide, tantalum oxide, barium strontium titanate, and forming the first and second sacrificial dielectric layers using at least one of chemical vapor deposition (CVD), low-pressure CVD (LPCVD), plasma-enhanced CVD (PECVD), sputtering, physical vapor deposition (PVD), and thermal growing.

17. The method of claim 11, wherein forming the first and second openings in the first and second sacrificial dielectric layers includes forming the first and second openings in the first and second sacrificial dielectric layers using the etch stop layer and a mask of photoresist, respectively, the etch stop layer and the mask of photoresist being formed and patterned above the first and second sacrificial dielectric layers, respectively.

18. The method of claim 17, wherein using the mask of photoresist and the etch stop layer includes using at least one etch stop layer formed of silicon nitride.

19. The method of claim 11, wherein removing the copper and the at least one barrier metal layer and the copper seed layer includes planarizing the copper.

20. The method of claim 19, wherein planarizing the copper includes using chemical mechanical polishing.

* * * * *